US008747065B2

United States Patent
Zeng et al.

(10) Patent No.: US 8,747,065 B2
(45) Date of Patent: Jun. 10, 2014

(54) FAN ASSEMBLY

(75) Inventors: Biao Zeng, Wuhan (CN); Xiang Zhang, Wuhan (CN); Zhi-Guo Zhang, Wuhan (CN); Heng Tao, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 23 days.

(21) Appl. No.: 13/550,682

(22) Filed: Jul. 17, 2012

(65) Prior Publication Data
US 2013/0142644 A1 Jun. 6, 2013

(30) Foreign Application Priority Data

Dec. 6, 2011 (CN) .......................... 2011 1 0400480

(51) Int. Cl.
*F04D 29/52* (2006.01)
(52) U.S. Cl.
USPC ...................................... 415/213.1

(58) Field of Classification Search
USPC ..................... 415/213.1, 214.1, 220; 361/695
See application file for complete search history.

(56) References Cited

U.S. PATENT DOCUMENTS

| 6,067,227 A * | 5/2000 | Katsui et al. .................. 361/695 |
| 2005/0280990 A1 * | 12/2005 | Goodenough et al. ........ 361/695 |
| 2007/0154308 A1 * | 7/2007 | Yang ............................. 415/220 |

* cited by examiner

*Primary Examiner* — Nathaniel Wiehe
*Assistant Examiner* — Brian O Peters
(74) *Attorney, Agent, or Firm* — Novak Druce Connolly Bove + Quigg LLP

(57) ABSTRACT

A fan assembly includes a bracket and a fan module. The bracket includes a ventilation plate. A limiting portion protrudes from the ventilation plate. The fan module is secured to the ventilation plate and includes a frame and a plurality of fan blades. The frame includes a first sidewall and a second sidewall opposite to the first sidewall. The plurality of fan blades are received in the frame, and each of the plurality of fan blades includes a first edge adjacent to the first sidewall and a second edge adjacent to the second sidewall. A height of the limiting portion is greater than a distance between the first edge and the first sidewall and smaller than a distance between the second edge and the second sidewall.

19 Claims, 3 Drawing Sheets

FAN ASSEMBLY

BACKGROUND

1. Technical Field

The present disclosure relates to fan assemblies, and more particularly to a fan assembly with a foolproof design.

2. Description of Related Art

A fan assembly is provided in an electronic device for cooling electronic components. However, the fan assembly can be incorrectly installed if care is not taken during the installation. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
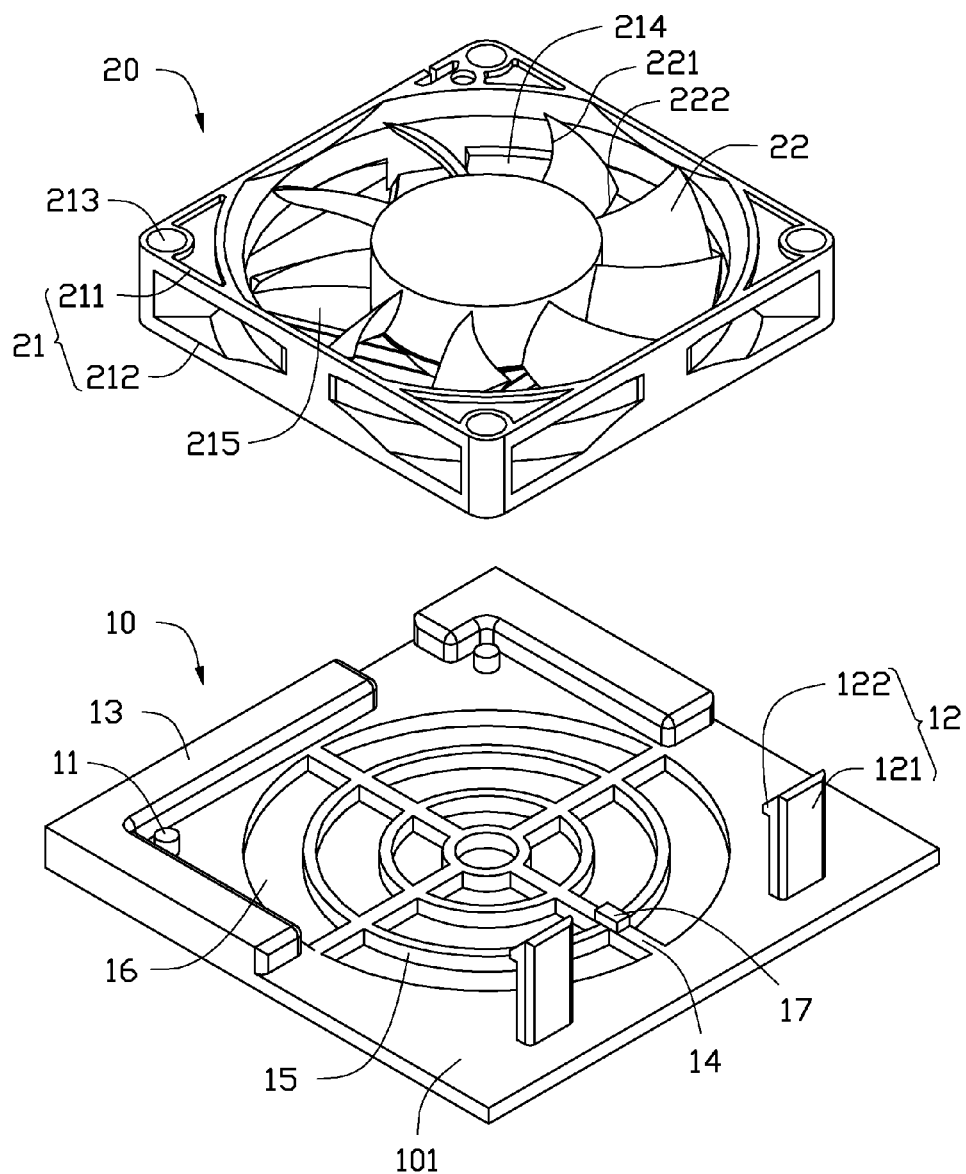
FIG. 1 is an exploded, isometric view of one embodiment of a fan assembly.
Figure 2:
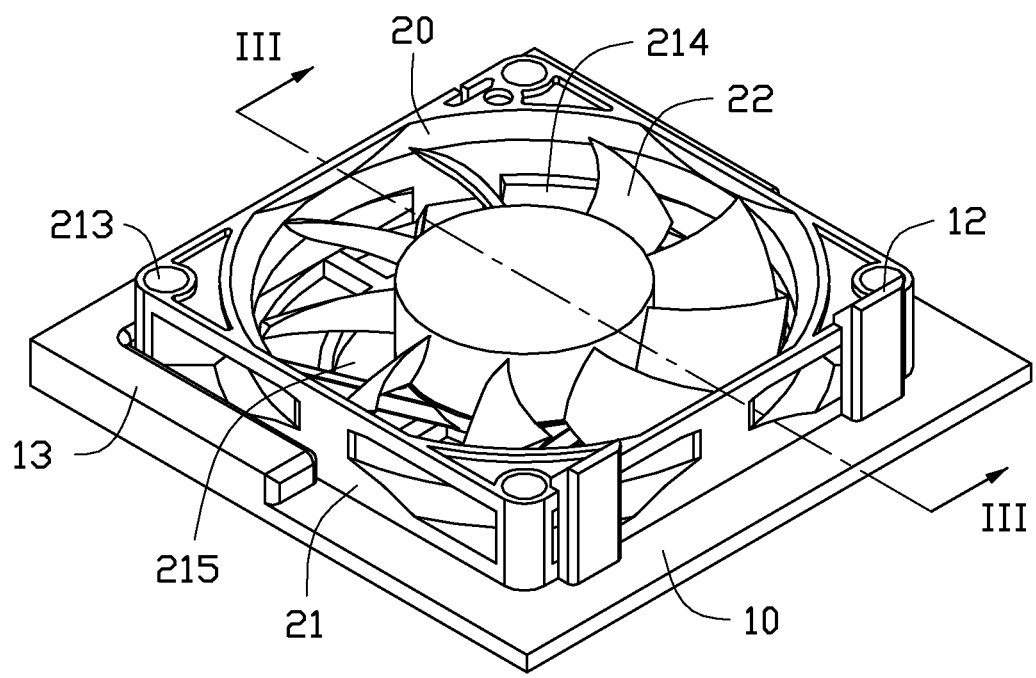
FIG. 2 is an isometric view of an assembled fan assembly of FIG. 1.

FIG. 1 and FIG. 2, show a fan assembly in accordance with one embodiment. The fan assembly includes a fan module 20 and a bracket 10.

The fan module 20 includes a frame 21 and a plurality of fan blades 22 mounted in the frame 21. The frame 21 includes a first sidewall 211 and a second sidewall 212 opposite to the first sidewall 211. Each of four corners of the first sidewall 211 defines a positioning hole 213. A size of the first sidewall 211 is substantially equal to that of the second sidewall 212. An air inlet 214 is defined in the first sidewall 211. An air outlet 215 is defined in the second sidewall 212. Each of the plurality of fan blades 22 includes a first edge 221 and a second edge 222. The first edge 221 is adjacent to the first sidewall 211. The second edge 222 is adjacent to the second sidewall 212.

The bracket 10 includes a ventilation plate 101 and at least two positioning posts 11 protruding from the ventilation plate 101. Two latching portions 12 and two blocking portions 13 extend from the ventilation plate 101. Each of two latching portions 12 includes a connecting arm 121 and a hook 122 extending horizontally from the connecting arm 121. The ventilation plate 101 includes four support ribs 14 and a plurality of connecting ribs 15. The plurality of connecting ribs 15 is connected between each adjacent two of the four support ribs 14, so as to form a plurality of ventilation openings 16. The plurality of ventilation openings 16 is opposite to the air outlet 215. A limiting portion 17 protruding from one of the four support ribs 14. A height of the limiting portion 17 is greater than a first distance between the first edge 221 and the first sidewall 211. The height of the limiting portion 17 is smaller than a second distance between the second edge 222 and the second sidewall 212. In one embodiment, each of the two blocking portions 13 has an "L" shape.

Figure 3:
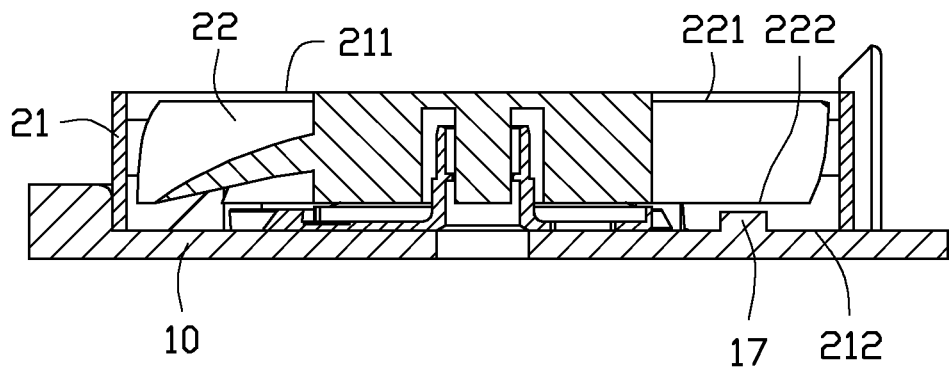
FIG. 3 is a cross-sectional view taken along a line III-III in FIG. 2.

FIG. 3 shows that, in assembly, the second sidewall 212 faces the ventilation plate 101, and each of the two positioning posts 11 is aligned with a corresponding positioning hole 213. The fan module 20 is moved towards the ventilation plate 101, until the second sidewall 212 abuts the ventilation plate 101. Each of two positioning posts 11 is engaged in the corresponding positioning hole 213. The hook 122 is engaged with a top surface of the first sidewall 211, and the fan module 20 is located between the hook 122 and the ventilation plate 101, preventing the fan module 20 from moving along a first direction substantially perpendicular to the ventilation plate 101. The fan module 20 is located between the connecting arm 121 and the blocking portion 13, preventing the fan module 20 from moving along a second direction substantially parallel to the ventilation plate 101. In this situation, because the height of the limiting portion 17 is smaller than the second distance between the second edge 222 and the second sidewall 212, the limiting portion 17 is located between the second edge 222 and the second sidewall 212 when the plurality of fan blades 22 are operated and does not block the plurality of fan blades 22. Thus, the fan module is operated normally and is correctly placed on the bracket 10.

If the first sidewall 211 faces the ventilation plate 101 and the fan module 20 is secured to the bracket 20. The first sidewall 211 abuts the ventilation plate 101, in this position, because the height of the limiting portion 17 is greater than the first distance between the first sidewall 211 and the first edge 221. A portion of the limiting portion 17 is located between adjacent two of the plurality of the fan blades 22 and blocks the plurality of fan blades 22 from rotating. Than, an alarming device (not shown) sounds/buzzes to warn a user that the fan module is incorrectly placed on the bracket 10.

What is claimed is:

1. A fan assembly comprising:
    a bracket comprising a ventilation plate, and a limiting portion protruding from the ventilation plate; and
    a fan module secured to the ventilation plate, the fan module comprising:
        a frame comprising a first sidewall and a second sidewall opposite to the first sidewall; and
        a plurality of fan blades received in the frame, and each of the plurality of fan blades comprising a first edge adjacent to the first sidewall and a second edge adjacent to the second sidewall;
    wherein a height of the limiting portion is greater than a distance between the first edge and the first sidewall and is smaller than a distance between the second edge and the second sidewall;
    wherein when the second sidewall is located between the first sidewall and abuts the ventilation plate, the limiting portion is located between the second edge and the second sidewall; when the first sidewall is located between the second sidewall and the ventilation plate, a portion of the limiting portion is located between adjacent two of the plurality of the fan blades and blocks the plurality of the fan blades from rotating.

2. The fan assembly of claim 1, wherein the first sidewall defines an air inlet, the second sidewall defines an air outlet, and an air path is defined by the air inlet, the plurality of fan blades, and the air outlet.

3. The fan assembly of claim 2, wherein the ventilation plate comprises four support ribs and a plurality of connecting ribs connected between each adjacent two of the four support ribs, a ventilation opening is defined between each of the four support ribs and each of the plurality of connecting ribs, and the ventilation opening is opposite to the air outlet.

4. The fan assembly of claim 3, wherein the limiting portion protrudes from one of the four support ribs.

5. The fan assembly of claim 1, wherein the frame defines at least one positioning hole, the bracket further comprises at least one positioning post protruding from the ventilation plate, and the positioning post is engaged in the positioning hole.

6. The fan assembly of claim 1, wherein the bracket further comprises at least one latching portion located on the ventilation plate, the latching portion comprises a connecting arm and a hook extending from the connecting arm, and the hook engages with the fan module; and the fan module lies between the hook and the ventilation plate, to prevent the fan module from moving along a first direction substantially perpendicular to the ventilation plate.

7. The fan assembly of claim 6, wherein the bracket further comprises a blocking portion located on the ventilation plate, and the fan module is located between the blocking portion and the connecting arm, to prevent the fan module from moving along a second direction substantially parallel to the ventilation plate.

8. The fan assembly of claim 7, wherein the blocking portion has an "L" shape.

9. The fan assembly of claim 7, wherein the connecting arm is substantially perpendicular to the ventilation plate.

10. A fan assembly comprising:
a bracket comprising a ventilation plate, and a limiting portion protruding from the ventilation plate; and
a fan module secured to the ventilation plate, the fan module comprising:
a frame comprising a first sidewall and a second sidewall opposite to the first sidewall; and
a plurality of fan blades received in the frame, and each of the plurality of fan blades comprising a first edge adjacent to the first sidewall and a second edge adjacent to the second sidewall;
wherein when the second sidewall is located between the first sidewall and abuts the ventilation plate, the limiting portion is located between the second edge and the second sidewall; when the first sidewall is located between the second sidewall and the ventilation plate, a portion of the limiting portion is located between adjacent two of the plurality of the fan blades and blocks the plurality of the fan blades from rotating.

11. The fan assembly of claim 10, wherein a height of the limiting portion is greater than a distance between the first edge and the first sidewall and is smaller than a distance between the second edge and the second sidewall.

12. The fan assembly of claim 10, wherein the first sidewall defines an air inlet, the second sidewall defines an air outlet, and an air path is defined by the air inlet, the plurality of fan blades, and the air outlet.

13. The fan assembly of claim 12, wherein the ventilation plate comprises four support ribs and a plurality of connecting ribs connected between each adjacent two of the four support ribs, a ventilation opening is defined between each of the four support ribs and each of the plurality of connecting ribs, and the ventilation opening is opposite to the air outlet.

14. The fan assembly of claim 13, wherein the limiting portion protrudes from one of the four support ribs.

15. The fan assembly of claim 10, wherein the frame defines at least one positioning hole, the bracket further comprises at least one positioning post protruding from the ventilation plate, and the positioning post is engaged in the positioning hole.

16. The fan assembly of claim 10, wherein the bracket further comprises at least one latching portion located on the ventilation plate, the latching portion comprises a connecting arm and a hook extending from the connecting arm, and the hook engages with the fan module; and the fan module lies between the hook and the ventilation plate, to prevent the fan module from moving along a first direction substantially perpendicular to the ventilation plate.

17. The fan assembly of claim 16, wherein the bracket further comprises a blocking portion located on the ventilation plate, and the fan module is located between the blocking portion and the connecting arm, to prevent the fan module from moving along a second direction substantially parallel to the ventilation plate.

18. The fan assembly of claim 17, wherein the blocking portion has an "L" shape.

19. The fan assembly of claim 17, wherein the connecting arm is substantially perpendicular to the ventilation plate.

* * * * *